United States Patent [19]

Wilreker et al.

[11] 4,295,094
[45] Oct. 13, 1981

[54] HIGH VOLTAGE HIGH FREQUENCY ANALOG SIGNAL MEASURING SYSTEM

[75] Inventors: Victor F. Wilreker; William H. Smith, both of Greensburg, Pa.

[73] Assignee: Westinghouse Electric Corp., Pittsburgh, Pa.

[21] Appl. No.: 34,308

[22] Filed: Apr. 30, 1979

[51] Int. Cl.³ .................... G01R 19/26; G01R 15/04
[52] U.S. Cl. ........................ 324/96; 324/120; 324/126; 340/870.29
[58] Field of Search ............... 324/96, 102, 126, 127, 324/120; 340/190, 870.29

[56] References Cited

U.S. PATENT DOCUMENTS 3,963,931  6/1976  Shapiro ........................... 324/96

OTHER PUBLICATIONS

Signetics App. Handbook; pp. 6-1 to 6-64; pub. by Patti Foley, 645 Stewart Ave., Garden City, N.Y. 11530.
Nourse, G.; "An Automatic . . ."; IEEE Power System 1978—Power Eng. Soc. Summer Meeting; Jul. 16, 1978; Los Angeles, Calif.
Harvey, J. T.; "An FM Terminal . . ."; AWA Tech. Review; vol. 16; No. 2; 1977; pp. 53-57.

Primary Examiner—Ernest F. Karlsen
Attorney, Agent, or Firm—C. M. Lorin

[57] ABSTRACT

Two phase-locked loop (PLL) solid state devices are used in conjunction with a fiber optics transmitter-receiver link in order to derive at a remote location an analog signal which is a representation of an inputted analog signal. Frequency-modulation is used in an analog signal measurement context to provide a bandwidth extending from direct current to a frequency of the order of 125 kHz. The transmitter portion is integrated within the base enclosure of a high voltage coupling capacitor connected between a high voltage power line and ground to provide high voltage protection and measurement capability for high frequency high voltage transients or surges in relation to high voltage power lines from the remote location.

11 Claims, 11 Drawing Figures

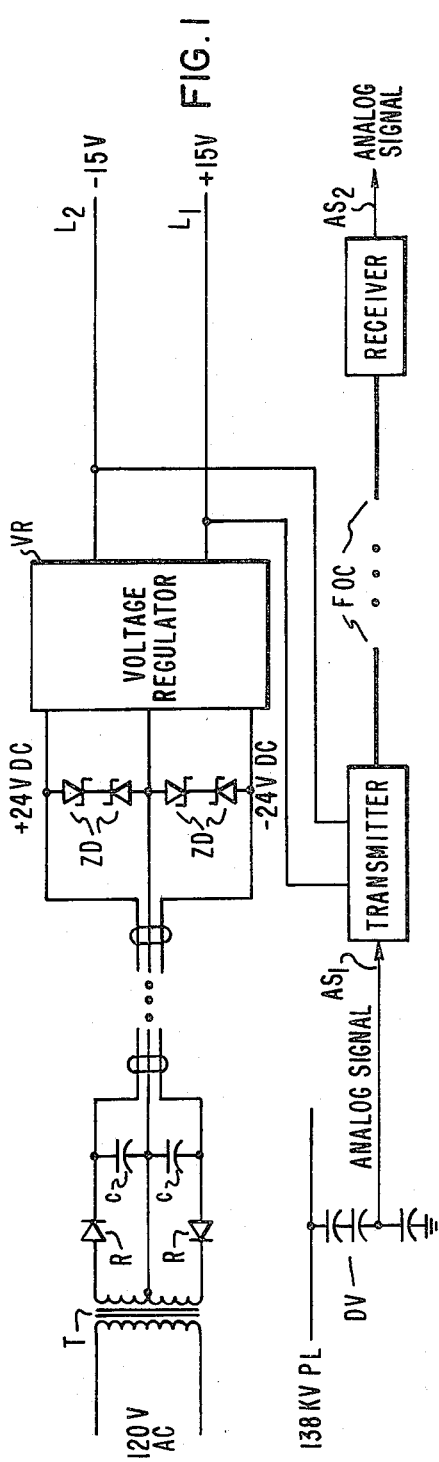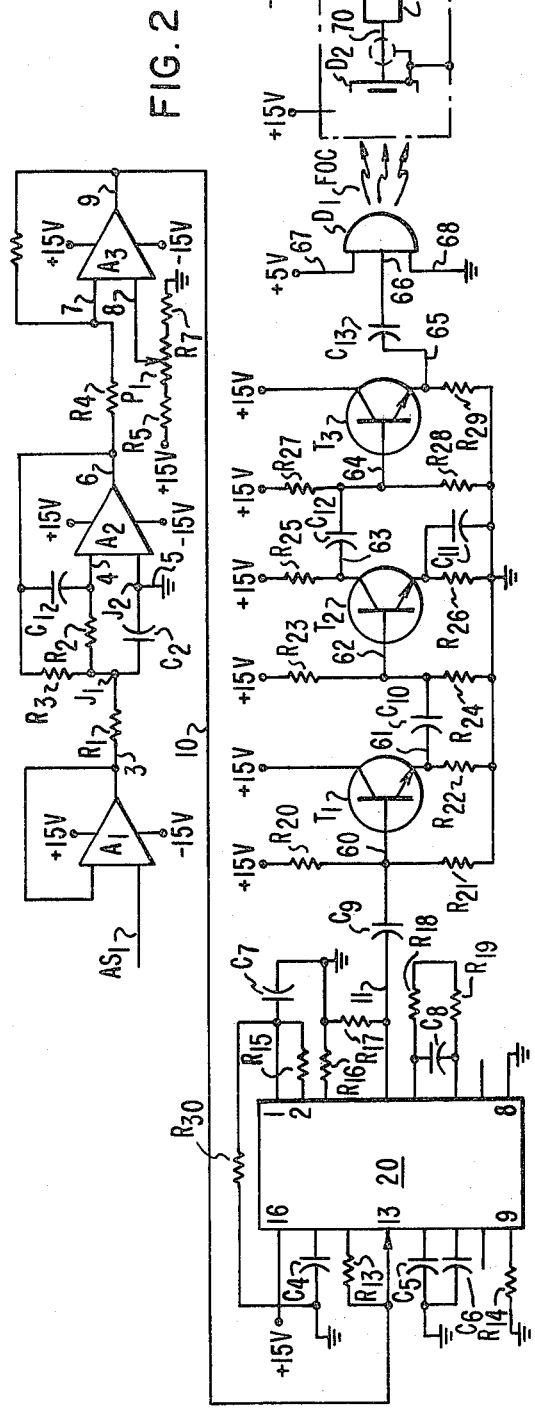
FIG. 1
FIG. 2

HIGH VOLTAGE HIGH FREQUENCY ANALOG SIGNAL MEASURING SYSTEM

BACKGROUND OF THE INVENTION

The invention relates to systems for measuring analog signals in general and in particular to measuring systems for high voltage high frequency analog signals.

The prior art is replete with data acquisition systems which utilize digital techniques for accurately and continuously deriving information relative to analog input signals at a plurality of remote stations.

An approach to remotely detecting an analog input signal and faithfully transmitting such information to a receiving station is to use frequency modulation and effect transmission via an optical fiber link. These techniques, however, are not directly applicable to the detection and measurement of high voltage and high frequency signals. One of the main difficulties lies in the hostile environment caused by the high voltage field and by noise interference affecting the quality of the measured signal.

The analog signal to be detected characterizes voltage and current transient phenomena found in 34.5 KV-500 KV transmission lines. The events triggering such transients are unpredictable. Therefore, to capture such transient phenomena a recording system must be on-line at all times. The high voltage field at the measuring point is a constant threat for the electronic components and many noises interfere with the signal. The problems caused by such hostile environment are compounded by the fact that a sophisticated solid state electronic equipment has to be interfaced with equipment which by nature is capable of withstanding high voltages. Such electronic equipment is necessary in order to provide the frequency response and dynamic range imposed by fast front surges due to lightning and line switching transients.

An object of the present invention is to combine high voltage equipment with electronic equipment in a system for recording high voltage, high frequency analog signals derived from a power line.

Another object of the present invention is to provide an improved transmission and detection of such analog signal through frequency modulation to a remotely located measuring station.

Optically-isolated signal transmission lines are known. See for instance "An Automatic Transient Recording System—The CLD Monitor Station" by G. Nourse—a paper presented at the IEEE PES Summer Meeting, Los Angeles, CA, July 16-21, 1978. Broad bandwidth is desirable as well as isolation for remote transmission. An optical link satisfies both requirements. However, the prior art does not teach, except by digital techniques, how such bandwidth requirement can be satisfied at the signal conversion stage, e.g., from an electrical into an optical signal.

Another object of the invention is to measure currents and/or voltages over a frequency range extending from direct current to 100 kilohertz and to transmit such baseband information from the point of measurement to the recording instruments with a minimum of noise or signal degradation.

Lightning surges and switching transients are a recurrent problem for power utilities. It is important to detect and measure such occurrences not only to provide a better protection of the power lines but also to improve the overall network design. Current, or voltage measurement calls for voltage isolation. It is also necessary to provide a remote transmission of analog data to a monitoring or control panel free from the hostile environment.

It is known to derive a measurement of a high tension power line voltage with a capacitor divider coupled to the line at the point of measurement.

A further object of the present invention is to provide a new approach to the derivation of a measurement of high voltages, or currents (for instance, transients and surges) on power lines, such as those due to lightning, and to an improved transmission of the derived signal at a distance from the measurement location.

The invention further bears on reliability, simplicity of design, and cost reduction for measurements in an hostile environment from a remote location. For this purpose, integrated circuit techniques which had been heretofore reserved to digital treatment of signals are used, according to the present invention, in the field of high voltage and/or current measurement including transients and surges.

SUMMARY OF THE INVENTION

According to the present invention a detected analog input signal is converted into a frequency signal, which, in turn, is converted into light and transmitted through fiber optics to a receiving station where it is reconverted from optical into electrical, then converted from a frequency signal into an analog signal, thereby providing a faithful replica of the original analog input signal. The aforementioned conversion steps are performed with solid-state devices, in particular two phase-locked loop devices are used, one to convert the measured analog signal from magnitude to frequency at the transmitting stage, a second device effecting a frequency to magnitude transformation at the receiving stage. The system is specially designed so as to be able to withstand a high voltage environment, as well as to satisfy bandwidth requirements.

The main advantages of such a system lie in a high signal-to-noise ratio, a high frequency response and a large dynamic range. This is achieved with simplicity of design and a reduction in cost by modular building with solid-state components. The measuring system affords reliability and easiness of maintenance.

BRIEF DESCRIPTION OF THE DRAWINGS

FIG. 1 is a schematic representation of the invention as used in the preferred embodiment;

FIG. 2 shows the transmitter stage of the signal transmission and reception system of FIG. 1;

DESCRIPTION OF THE PREFERRED EMBODIMENT

Figure 3:
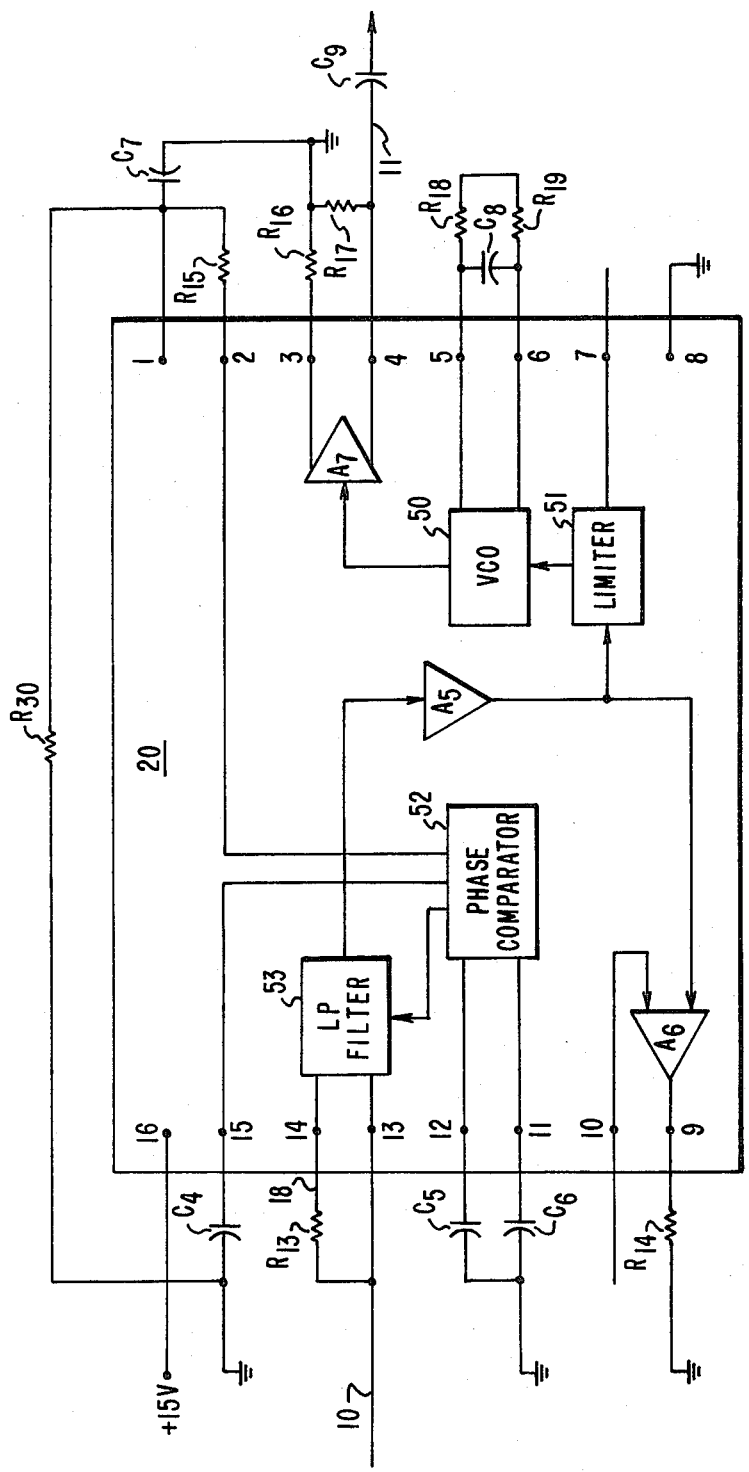
FIG. 3 illustrates diagrammatically the internal organization of the phase-locked loop solid-state device which is part of the transmitter stage of FIG. 2.

Referring to FIG. 1, according to the preferred embodiment of the invention, a measured analog signal is derived from a power line PL, for instance at 138 KV, through a capacitive divider DV. The analog signal derived on line $AS_1$ is applied to a transmitter-converter TC which feeds a fiber-optic cable FOC. At a remote receiving station, the other end of cable FOC feeds into a receiver-converter outputting on line $AS_2$ an analog signal which is a faithful replica of the analog signal inputted on line $AS_1$. $\pm 15$ V voltages on lines $L_1$ and $L_2$ are applied to the transmitter-converter TC. These voltages are obtained from the 120 volt AC network which is rectified by a rectifier R, after voltage transformation by a transformer T, to provide $\pm 24$ V applied by a cable to a voltage regulator VR generating and regulating a required voltage of $\pm 15$ V on lines $L_1$, $L_2$. Since high voltages may be experienced by the lines in the hostile environment of the power line PL, a protective network of zener diodes ZD is connected in parallel between the respective $\pm 24$ DC lines to the voltage regulator and the common mode.

Referring to FIG. 2, an analog input signal, on line $AS_1$, is inputted into the non-inverting input of an operational amplifier $A_1$, used as a buffer between capacitive divider DV and the transmitter converter TC. This is necessary because signal levels must not exceed $\pm 10$ volts peak. The amplifier serves as an input buffer with an input impedance of 1.5 $\Omega$ and an input capacitance of 4 pf. The outputted signal is fed from the output line 3, via resistors $R_1$, $R_2$ and line 4 into the first stage of a Butterworth filter. This filter is built around an operational amplifier $A_2$. It includes a capacitor $C_1$ in a first feedback loop and a resistor $R_3$ in a second feedback loop. A capacitor $C_2$ is connected in series with resistor $R_2$ and both are between the two inputs of the amplifier. One terminal of capacitor $C_2$ is connected to the junction $J_1$ common to the terminals of resistors $R_1$, $R_2$ and $R_3$. Junction $J_2$ connects the second terminal of capacitor $C_2$ to the non-inverting input of the amplifier and to ground by line 5. The input signal is admitted via line 3, resistor $R_1$, junction $J_1$, resistor $R_2$ and line 4 into the inverting input of amplifier $A_2$. The values of $C_1$, $C_2$ and of $R_2$ and $R_3$ determine the high frequency edge of the flat response characteristic intended by the overall Butterworth filter. The output of amplifier $A_2$ on line 6 is connected via resistor $R_4$ and line 7 to the inverting input of operational amplifier $A_3$. Operational amplifier $A_3$ mixes the filtered analog signal of line 7 with a DC bias voltage picked up from a resistive divider $R_5$, $R_6$, $R_7$ wherein $R_6$ has an adjustable arm to form a potentiometer. The moving arm is applied via line 8 to the non-inverting input of operational amplifier $A_3$. This DC bias is required because the phase-locked loop signal input e.g. pin 13, is biased at 10.7 volts.

Figure 4:
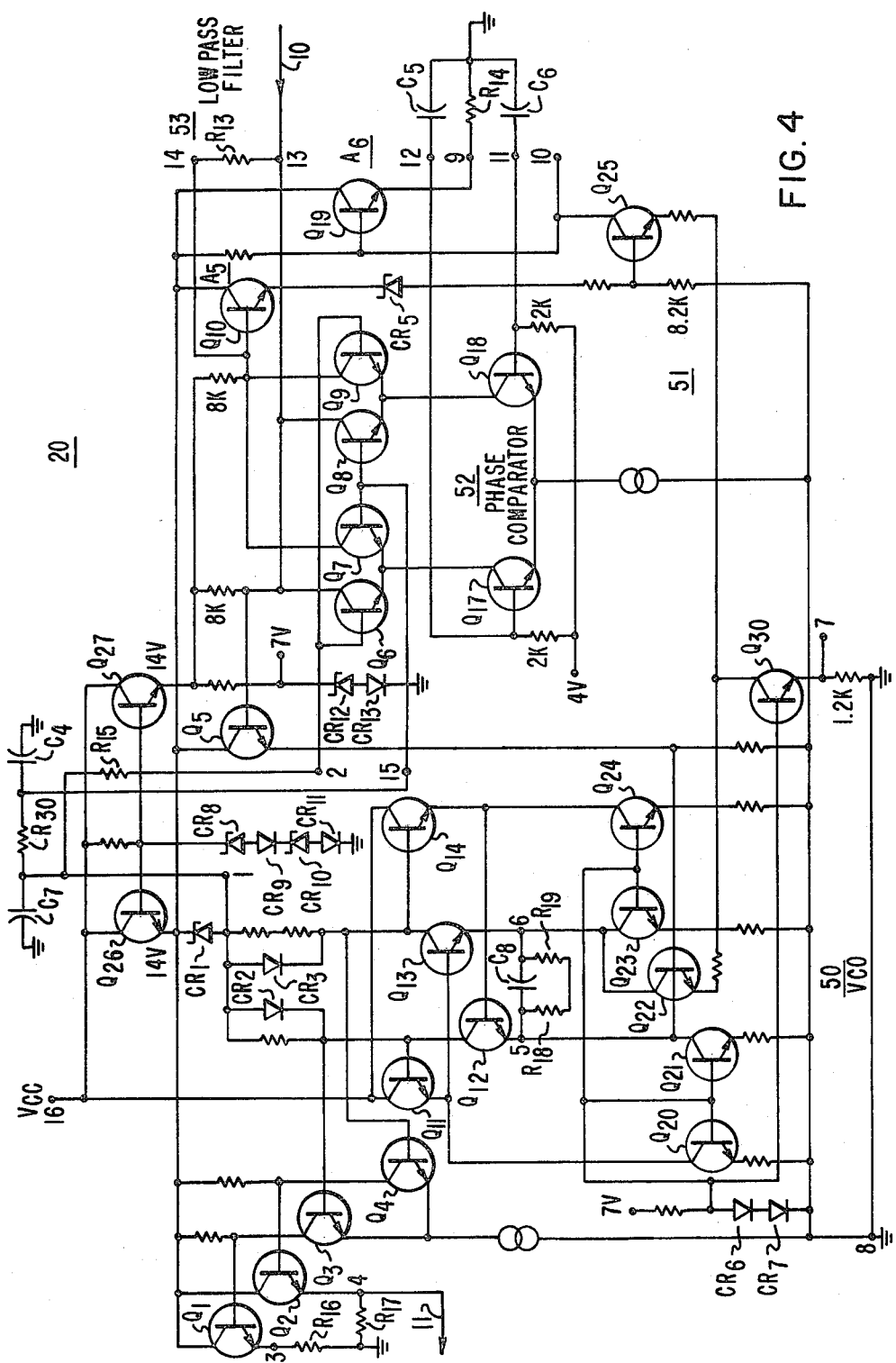
FIG. 4 gives a detailed view of the internal circuitry of the solid-state device of FIG. 3.
Figure 5:
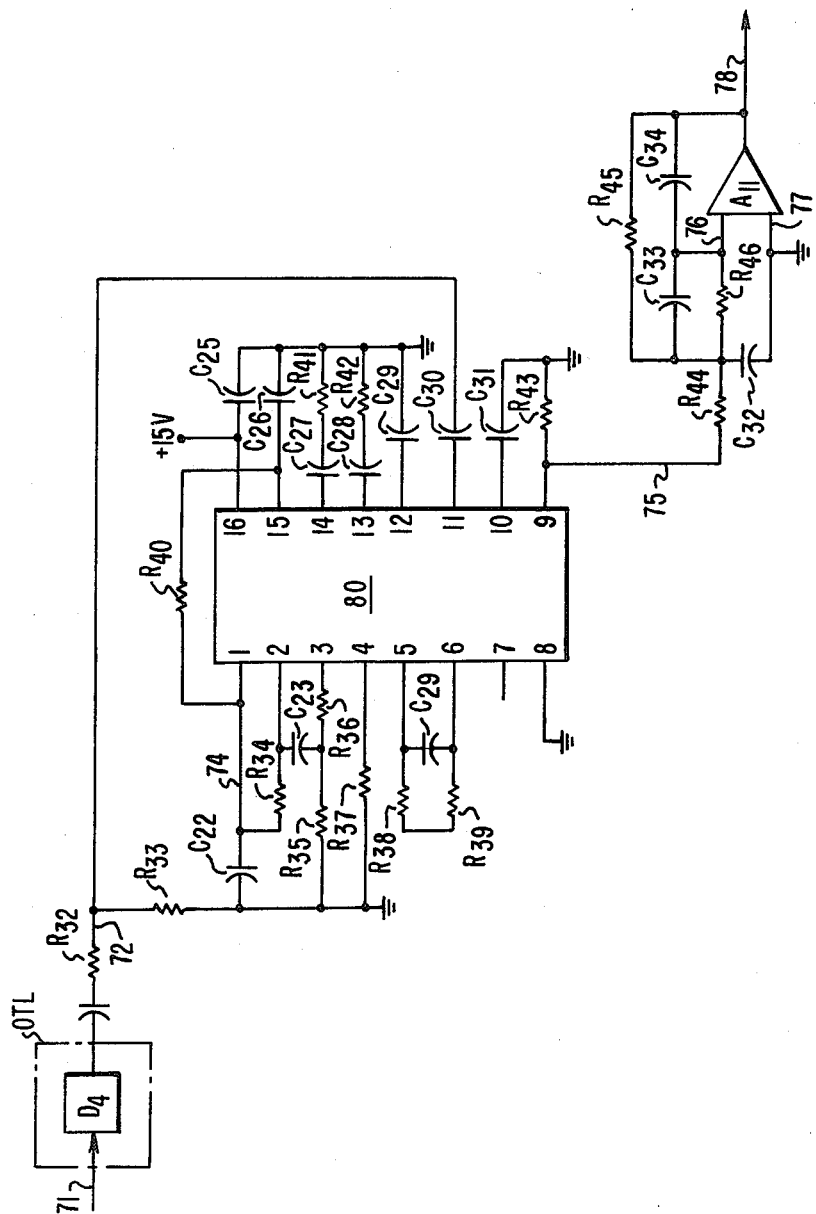
FIG. 5 shows the receiver stage of the signal transmission and reception system of FIG. 1.
Figure 6:
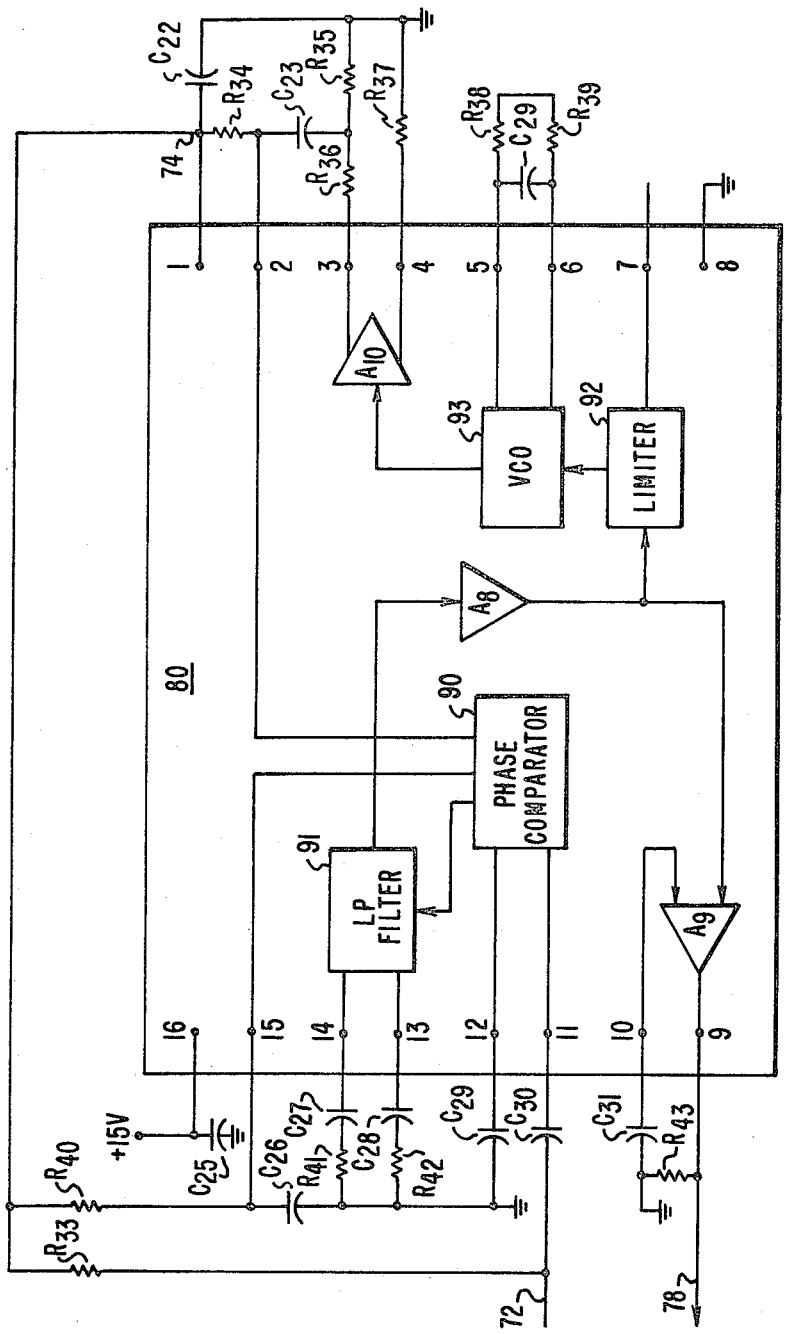
FIG. 6 illustrates diagrammatically the internal organization of the phase-locked loop solid-state device used in the receiver stage of FIG. 5.

The output of amplifier $A_3$ is connected via line 10 to pin 13 of a phase-locked loop (PLL) solid-state device 20 of the type SE562. For the purpose of describing PLL device 20, the "Signetics Application Handbook" referred to on page 102 of the IC Update Master Book of 1976 (645 Stewart Ave.—Garden City, N.Y. 11530) is hereby being incorporated by reference. This is a general purpose solid state device. Device 20 of FIG. 2 converts the amplitude modulated signal of line $AS_1$ received on pin 13 into a frequency modulated signal outputted on line 11 from pin 4. FIG. 3 shows schematically the internal organization of the device, and FIG. 4 shows the detailed circuitry modified by the adjunction of resistors and/or capacitors on or between pins of device 20 as shown in FIG. 2. Similarly, device 80 of FIG. 5 is a similar general purpose solid state device mounted as a phase locked loop converting the frequency signal of line 72 on pin 11 into an amplitude modulated signal outputted from pin 9 via line 75. Device 80 is schematically shown in FIG. 6 and in detail by FIG. 7.

As shown in FIG. 3, the solid state device includes a low-pass filter 53 interposed between a phase comparator 52, an amplifier $A_5$ and a buffer amplifier $A_6$. The phase-locked loop proper includes a limiter 51 and a voltage-controlled oscillator (VCO) 50 outputting into an operational amplifier $A_7$. Phase comparator 52 has a fixed condition at its two inputs, as shown by capacitors $C_5$, $C_6$ to ground from pins 12 and 11, capacitors $C_4$ and $C_7$ to ground from pins 15 and 2. Pin 13 is used as the analog signal input. Since the signal has already been filtered by the first stage of the Butterworth filter, no additional filtering is desired here. However, a resistor, $R_{13}$, is placed between pins 13 and 14 to reduce the overall loop gain. The signal has been filtered once by the first stage of the Butterworth filter ($A_2$). Resistor $R_{13}$ (between pins 13 and 14) is used in order to reduce the overall loop gain. The output of the low-pass filter amplifier $A_5$ in the device (formed by the components associated with transistors $Q_5$–$Q_{10}$) modulates the voltage controlled oscillator 50 (formed by the components associated with transistors $Q_{11}$–$Q_{24}$) about a center frequency. The outer frequency is determined by the value of capacitor $C_8$ and resistors $R_{18}$, $R_{19}$, between pins 5 and 6. The output of VCO buffer amplifier $A_7$ (formed by the components associated with transistors $Q_1$, $Q_2$, $Q_3$) is taken on line 11 from pin 4 of the solid-state device 20. The output of the low-pass filter amplifier modulates the voltage controlled oscillator (VCO) about a center frequency. The center frequency is determined by the value of capacitor $C_8$. The VCO buffer amplifier output is taken from pin 4. The VCO has a free-running speed defined by the inductance due to capacitor $C_8$ between pins 5 and 6 and a parallel resistance formed by $R_{18}$ and $R_{19}$. As generally known, the amplitude of the signal in the loop from filter 53 into amplifier $A_5$, limiter 51 and VCO 50 causes the frequency of the VCO to deviate and a frequency encoded signal is outputted by the VCO on pin 3 and line 11 from the output of operational amplifier $A_7$. Resistors $R_{15}$ and $R_{17}$ are mounted in series between pins 3 and 4 at the output of $A_7$. Pin 1 is connected via resistor $R_{30}$ to pin 15. Resistor $R_{15}$ is interposed between pin 2 and capacitor $C_7$. The potential $+15$ V from the regulator VR is applied to pin 16.

Pin 8 is connected to ground. The output of amplifier $A_6$ on pin 9 is connected to ground via resistor $R_{14}$.

Referring again to FIG. 1, frequency modulated signal 11 from device 20 at the transmitting stage is inputted via coupling capacitor $C_9$ and line 60 to the base of a buffer transistor $T_1$, then via transistor $T_2$, used as an amplifier, and from there into another buffer transistor $T_3$. From the emitter of $T_3$, via line 65, the signal is inputted through coupling capacitor $C_{13}$ and input line 66 into an optical transmission line OTL including an LED fiber optic transmitter $D_1$. The FM encoded signal is, thereafter, transmitted with a cable fiber optic link as far as the remote receiving station. There, the optical signal is reconverted into an electrical signal by a positive-intrinsic-negative (PIN) diode $D_2$. A TTL line driver circuit $D_3$ is used to facilitate the transmission of the PIN diode output over a twin axial cable 71.

The combined LED fiber optic transmitter $D_1$ fiber optics link, converter $D_2$ and TTL line driver circuit are sold on the market as a unit under the trade name SPX2674 of Spectronix. This is a high speed digital optical transmission line system which may have a physical length of three hundred meters. It is used here not as a digital data acquisition system, but rather for transmission of analog data.

Referring to FIG. 5, the twin axial cable is connected at its terminal to a TTL line receiver $D_4$. The TTL line receiver is sold on the open market under the code name 9613. FIG. 5 shows in block diagram the PLL decoder 80. The frequency signal from $D_4$ is applied via line 72 to pin 11 of solid-state device 80 also sold on the open market under the trade name SE562.

As explained earlier, device 80 is a general purpose phase-locked loop (PLL) containing, as shown by FIG. 6, a voltage controlled oscillator (VCO) 93, a phase comparator 90, a low-pass filter 91, a limiter 92 and a demodulator comprising operational amplifiers $A_8$ and $A_9$. Phase detector 90 compares the frequency of the inputted frequency signal of line 72 received on terminal 11 to the frequency of VCO 93 and generates an error voltage related to the phase and the frequency difference. After filtering by 91 and amplification by $A_8$, the VCO is controlled through limiter 92 so as to reduce the frequency difference. Once in lock, the VCO frequency is in direct relation to the one of the inputted signal and locking is achieved by correction for any small difference. Therefore, a proportional relation exists between the frequency of the input signal of line 72 and the magnitude of the amplitude modulated signal which is outputted on line 75 by amplifier $A_9$ (FIG. 6). The free running frequency of the VCO is determined by capacitor $C_{29}$ and resistors $R_{38}$, $R_{39}$ connected between pins 5 and 6. The FM encoded signal is applied via line 72 and capacitor $C_{30}$ to pin 11 which is the input terminal of phase comparator 90. When the VCO 93 is locked in frequency with the error at the output of comparator 90 from terminals 15 and 2, an amplitiude modulated signal is extracted from comparator 90 via filter 91, amplifier $A_8$ and amplifier $A_9$ over line 75.

Figure 7:
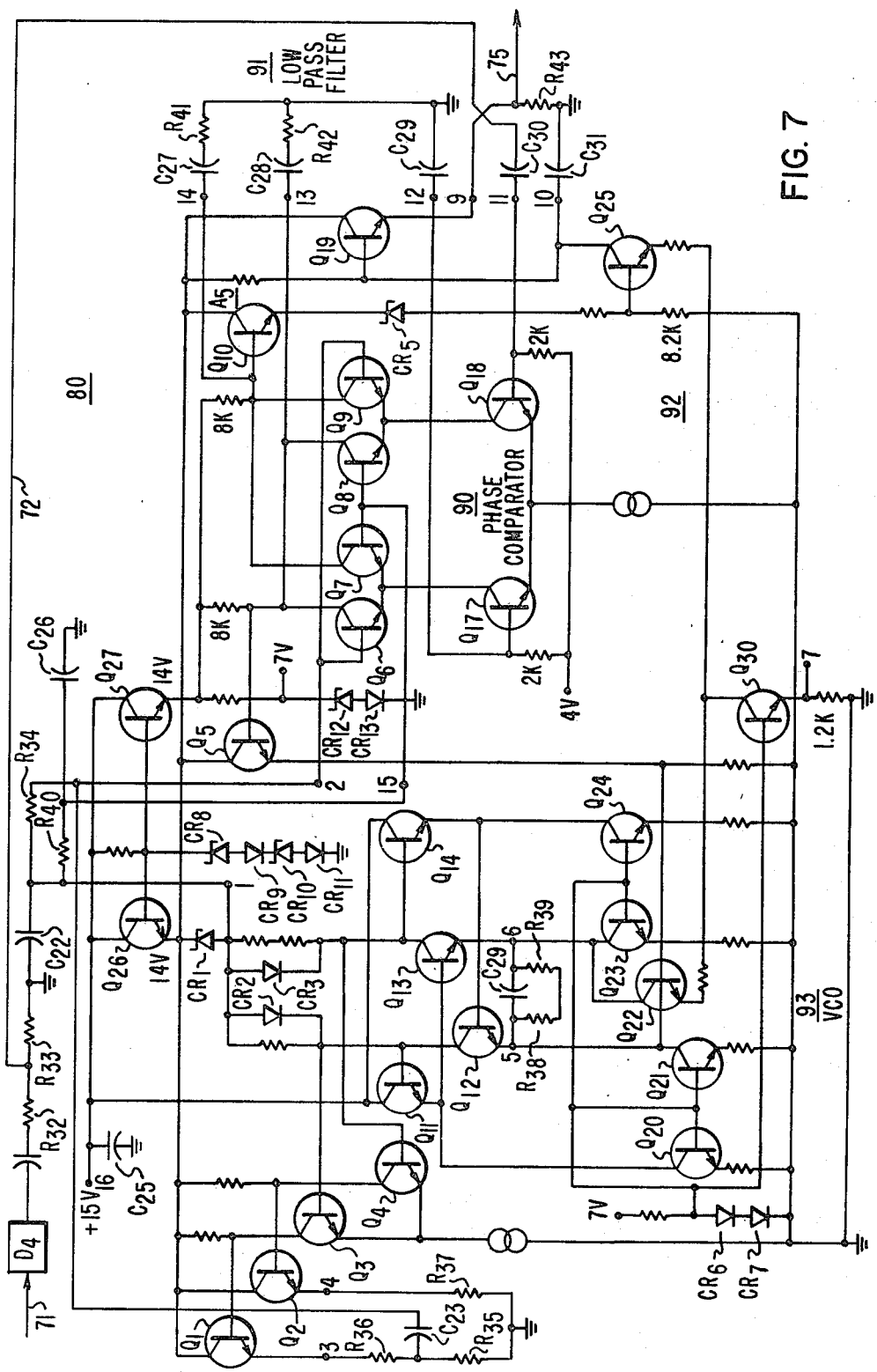
FIG. 7 is a detailed view of the internal circuitry of the solid-state device of FIG. 6.

Referring to FIG. 7, the internal organization of circuit 80 is shown in detail and can be understood by analogy with device 20 of FIG. 3 and by reference to the resistor and capacitor components connected between pairs of terminals (5,6), (3,4), (2,15), (11,12) and (13,14), forming the interconnection with terminal 1 of terminals 2, 11 and 15 or providing an individual connection with terminals 10, 16, 12, 7 and 8, as indicated on FIG. 6.

Figure 8:
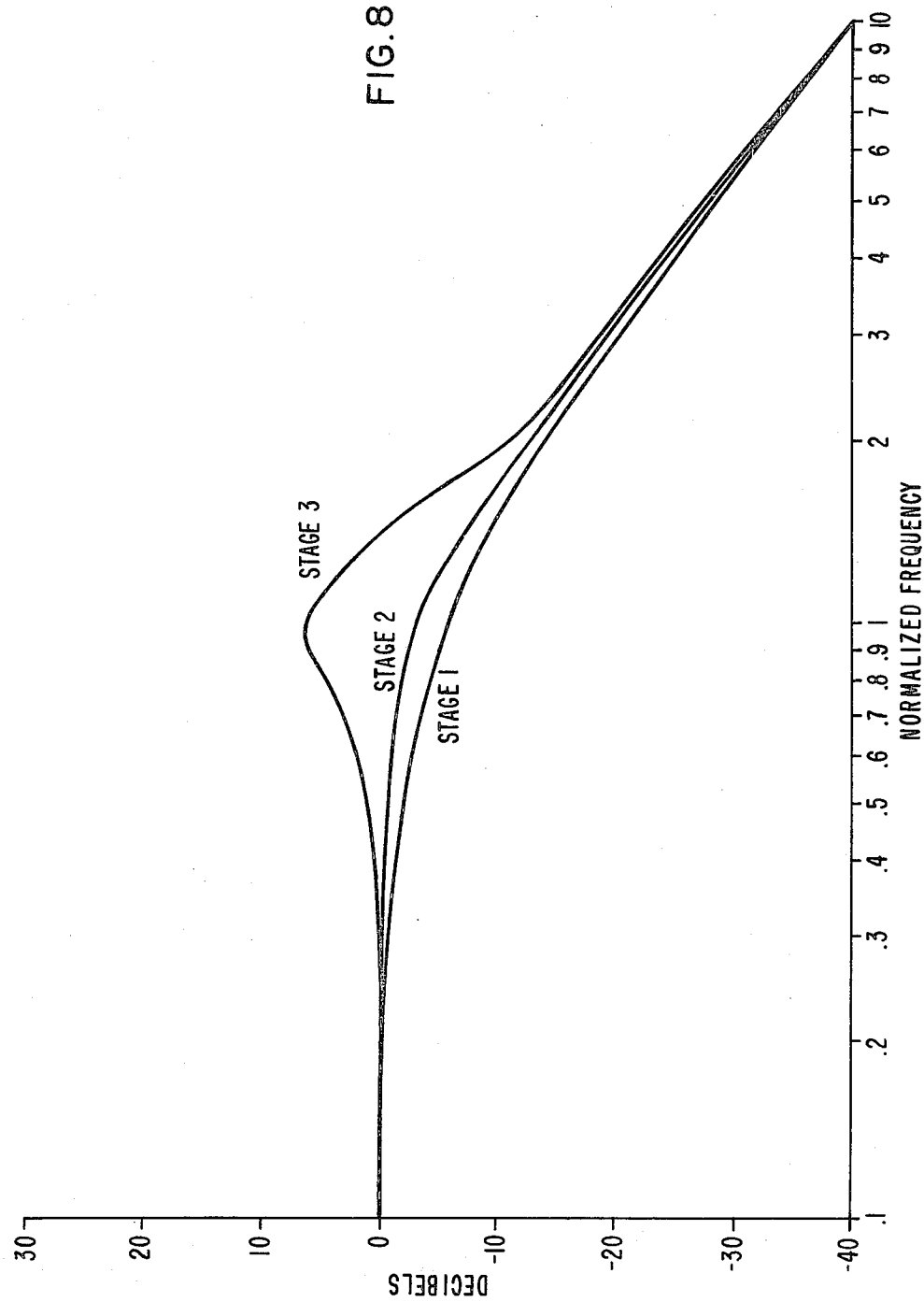
FIG. 8 provides curves which combine, in defining an overall frequency response characteristic resulting from Butterworth filter stages which are part of the signal transmission and reception system of FIGS. 2 and 5.

Here, at the receiver stage, the low-pass filter formed across pins 13 and 14 by capacitors $C_{27}$, $C_{28}$ and resistors $R_{41}$, $R_{48}$ constitutes a two-pole stage like the aforementioned first filtering stage provided by the network around amplifier $A_2$ in FIG. 1 at the transmitter stage. The demodulated analog output from pin 9 of device 80 is fed via line 75 (see FIG. 5) to a third filtering stage built around operational amplifier $A_{11}$ and including capacitors $C_{33}$ and $C_{34}$ in one feedback loop having a resistor $R_{45}$ in parallel, capacitor $C_{32}$ between the input lines 76, 77 of amplifier $A_{11}$. A resistor $R_{44}$ is inserted on line 75, while a resistor $R_{46}$ is connected in parallel with capacitor $C_{33}$ and in series with input line 76 to the inverting input of $A_{11}$. The outputted signal is on line 78. This third two-pole filtering stage constitutes the last part of a three-stage six-pole Butterworth filter. The overall frequency response characteristic of the three stage two-pole Butterworth filter is determined by the three curves of FIG. 8, which correspond to the three aforementioned individual stages, respectively. The signal transmission subsystem is specified to exhibit the frequency response curve of a six pole Butterworth filter with a cutoff frequency of 125 kHz. The purpose is to properly band limit the analog signal both to improve signal-to-noise ratio and to eliminate biasing during digital sampling and recording.

Figure 9:
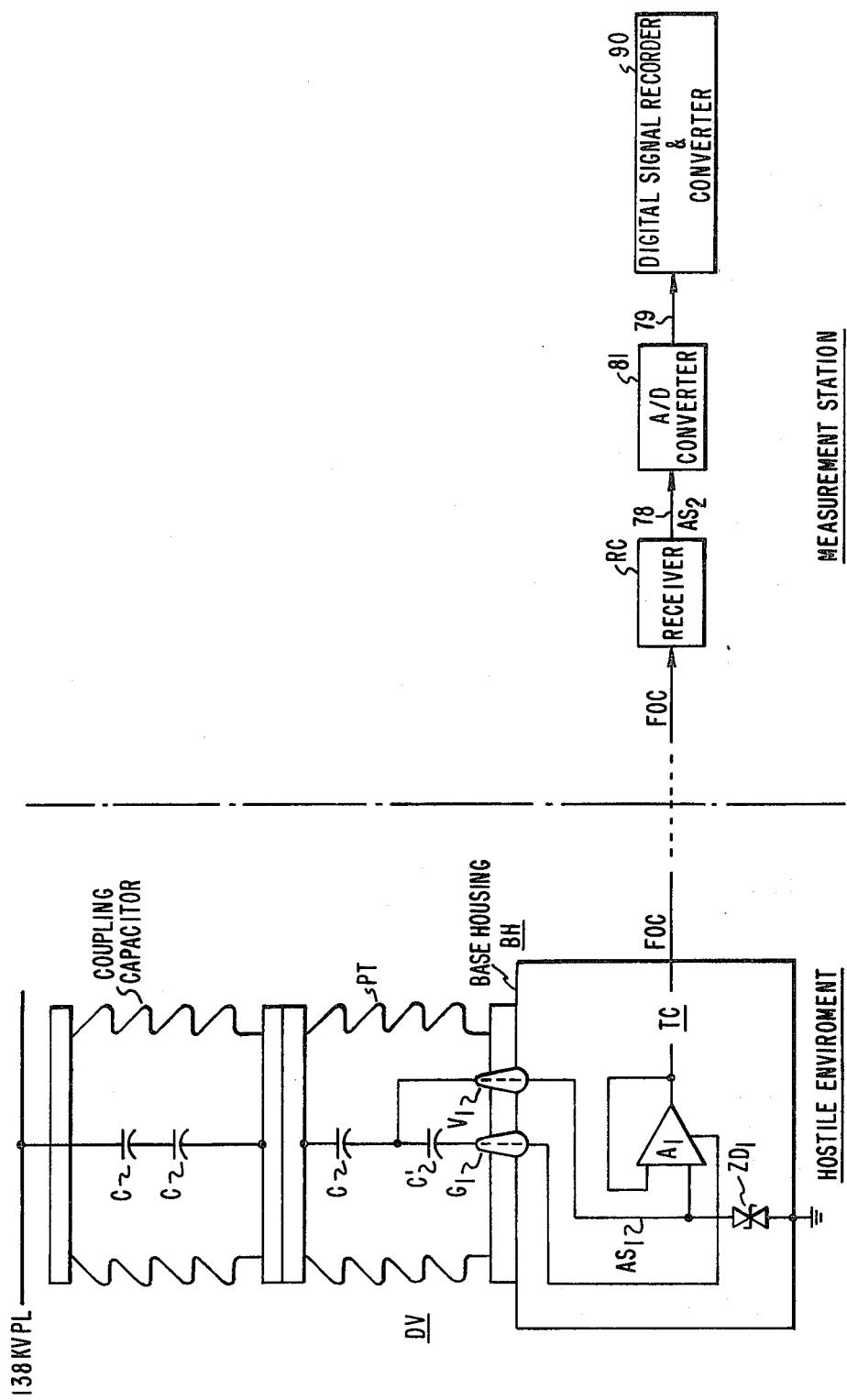
FIG. 9 shows the transmitter of the system according to the invention installed with a coupling capacitor in the hostile environment of a high voltage power line, and the receiver at the remote measuring station.

Referring to FIG. 9, the capacitor divider DV is shown connected to a 500 KV transmission line. Divider DV comprises a distributed capacitor C connected in series with another distributed capacitor C' to a ground bushing $G_1$ traversing the top wall of a metallic base housing BH. At the junction of C and C', typically 400 volts are derived which are led to a potential brushing $V_1$, also traversing the top wall of the base housing. A second divider $DV_1$ is provided inside the housing connected between $G_1$ and $V_1$. At the output of divider DV, a 10 volt peak signal $AS_1$ is derived which is applied to operational amplifier $A_1$ at the entry of the electronics of transmitter TC. A series network of protective Zener diodes is connected to ground at the input of operational amplifier $A_1$. The optical signal outputted by TC is led by fiber optics cable FOC through the side wall of the base housing, then, away from the hostile environment to the measurement station and the receiver RC. The latter locally provides an analog signal $AS_2$ on line 78 where, after being converted into digital form by A/D converter 81, the measured signal can be recorded and interpreted, for instance, by digital signal recorder and interpreter 90 as shown.

Figure 10:
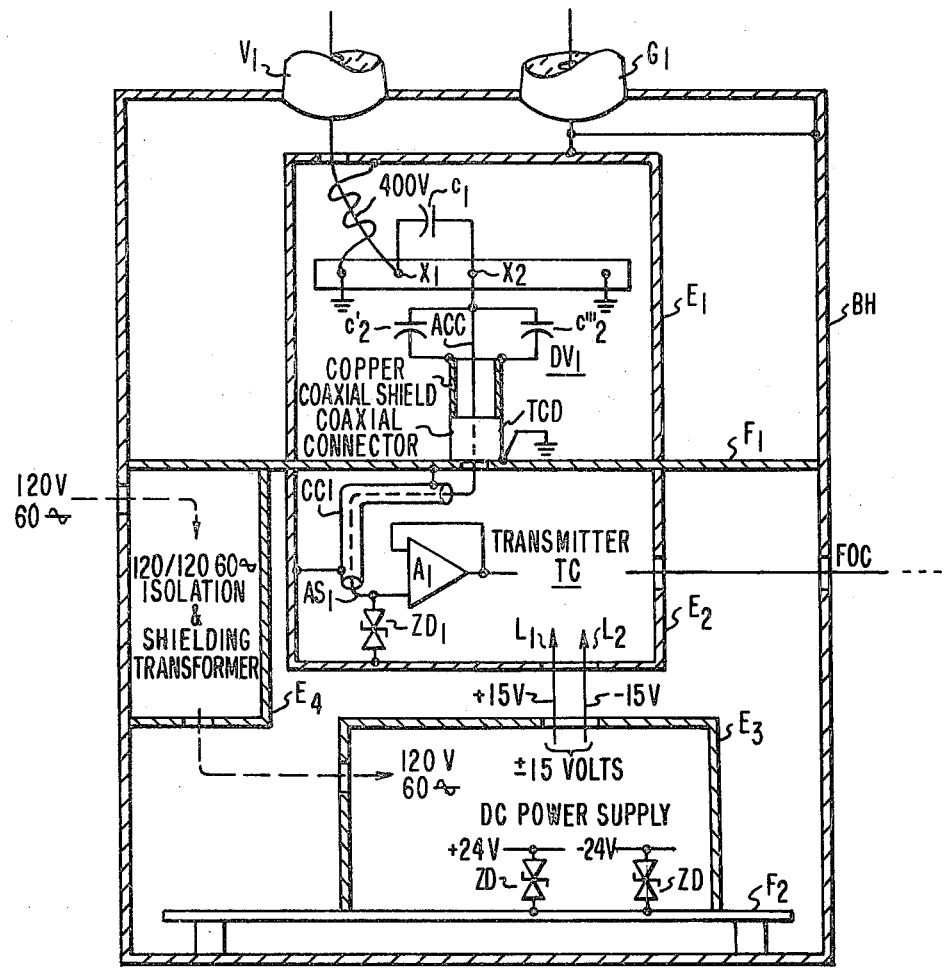
FIG. 10 is the base housing of the coupling capacitor with the electronics of the transmitter, the direct current power supply, the isolation transformer and a second stage divider, enclosed therein within respective separate metallic enclosures.

Referring to FIG. 10, the installation within base housing BH is shown with particularity for the purpose of describing the measures taken, in accordance with the invention by electrical connection, grounding and insulation to prevent parasitic fields, corona penetration and/or noise from interfering with the quality of the measured signal $AS_2$. These measures are taken while placing high sensitivity electronic circuitry of the transmitter TC close to the high tension measuring point. By remote transmission an acceptable signal is conveyed to the receiver station. In this respect, it is observed that without the measures described hereinafter, excessive noise levels would prevent any meaningful derivation analysis and display of a measurement signal by recorder 90. Precautions have to be taken not only with regard to signal $AS_1$, such as the use mentioned of protective Zener diodes $ZD_1$, but special care must also be taken as to how the electrical connections are made from terminals $G_1$, $V_1$, of divider DV, with the 120 volt AC power supply admitted into the base housing, as well as with the regulator supplying ±15 volt DC to the electronic equipment. Moreover, a specially designed second divider $DV_1$ is provided in the derivation of signal $AS_1$ from divider DV.

Figure 11:
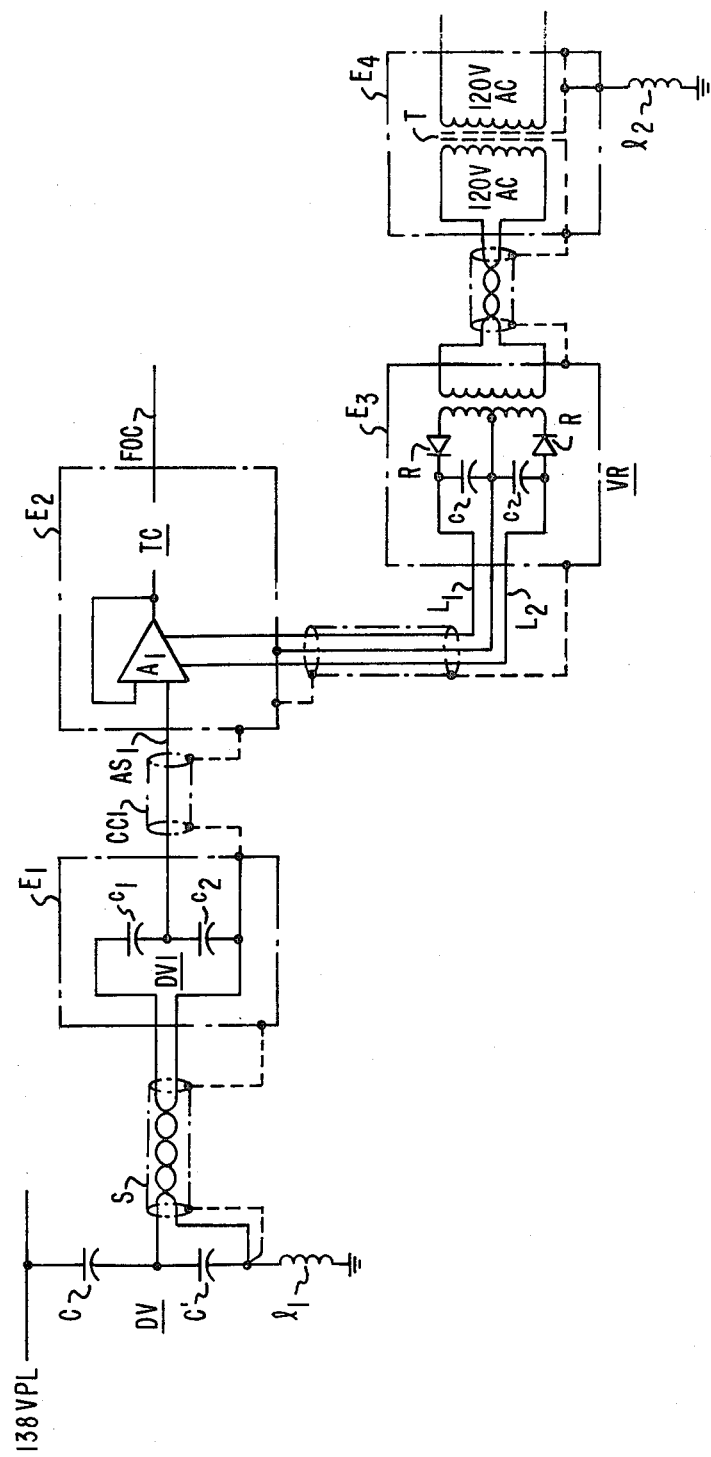
FIG. 11 is a schematic representation of the enclosed parts of FIG. 10 as electrically connected, grounded and insulated against parasitic fields, corona penetration and/or noise interference.

FIG. 11 shows: coupling capacitors C, C' forming divider DV; a second divider $DV_1$ comprising scaling capacitors $c_1$, $c_2$; coaxial cable CC for inputting from divider $DV_1$ into amplifier $A_1$ of transmitter TC; the isolation transformer T supplying AC to the DC power supply. The latter includes also a voltage regulator VR (not shown) for applying ±15 volts on lines $L_1$, $L_2$ to the electronic components of TC. Metallic enclosures are provided: $E_1$ for the scaling capacitors, $E_2$ for transmitter TC, $E_3$ for the DC power supply, and $E_4$ for the isolation transformer.

Referring again to FIG. 10, the enclosures are shown mounted within the base housing BH of divider DV. The housing BH is divided by an intermediate floor $F_1$ into an upper compartment and a lower compartment. Housing $E_1$ rests upon floor $F_1$. The lead from terminal bushing $V_1$ goes to a point $X_1$ of an isolation bracket after being passed through the top wall of enclosure $E_1$. The terminal of bushing $G_1$ is attached to enclosure $E_1$ for grounding, and enclosure $E_1$ is further connected to base housing BH. The bracket is fixed on the vertical wall of $E_1$. The lead from $V_1$ to point $X_1$ is shielded to ground. The first scaling capacitor $c_1$ is connected between point $X_1$ and a second point $X_2$ on the bracket. Capacitor $c_2$ connected from point $X_2$ to ground has been designed specially in order to eliminate corona penetration, stray field or any induction effect between the leads from $V_1$, and the ground to the input of $A_1$ while carrying signal AS from point $X_2$. Capacitor $c_2$ is formed of four identical capacitors $c'_2$; $c''_2$; $c'''_2$ and $c''''_2$ symmetrically disposed in spatial relation, so that only capacitors $c'_2$ and $c''_2$ which are in the plane of FIG. 1 are, actually shown in the drawing. From $X_2$ the lead for signal $AS_1$ is passed axially as a central conductor ACC between the four capacitors. This lead ACC is also connected at the top of the coaxial assembly and radially to each positive electrode of the four capacitors. Similarly, the four negative electrodes are radially connected toward the common axis to where they connect to a coaxial connector TCD mounted on floor $F_1$ upon an orifice allowing passage therethrough of the central conductor ACC. A copper shield joins connector TCD along the axis to the radial connections of the capacitors. In this fashion, a coaxial capacitor $c_2$ has been assembled between point $X_2$ and the ground, namely the entry of the desired signal $AS_1$ from point $X_2$ across enclosure $E_1$ onto the electronic circuit of transmitter TC. Thus, it is insured that the inductances of the various leads will symmetrically neutralize each other in all directions. Central conductor ACC is passed across floor $F_1$, by means of a coaxial cable CCl prolonging conductor ACC into enclosure $E_2$ which is attached below floor $F_1$ and, within base housing BH protects the electronics. Cable CCl is connected to the input of amplifier $A_1$ and shielded to ground between $F_1$ and $A_1$.

The direct current power supply rests within enclosure $E_3$ on the floor $F_2$ at the bottom of the base housing. The escalation and shielding transformer is mounted on the side wall of BH within enclosure $E_4$.

These measures concur in preventing adverse effects due to the high voltage surges and the strong surrounding fields. In particular, the electronic is protected from hard failures. The sophistication required for transmitter TC in order to derive a signal having high signal-to-noise ratio, a high dynamic range and sufficient frequency response could not be otherwise accommodated in the proximity of a high voltage coupling capacitor, such as DV.

This inherent incompatibility has been overcome by a careful design of the cable connections and proper electrostatic shielding. High frequency currents and high voltage differentials between the circuitry and metallic case $E_2$ have been eliminated. Also noise pickup by the divider $DV_1$ in the electronics or in the cable connections have been prevented, and corona noise has been made unable to enter the system.

The system just described allows recording in digital form of a true representation $AS_2$ of any analog signals which may at any time be generated, concurrently or successively, separate, or superposed. Since the improved high voltage high frequency recording system according to the invention provides a measured analog signal of increased signal to noise ration, of large dynamic range, it becomes possible to study and analyze the complex phenomena occurring on a power line when exposed to lightning, or to switching of the network. Moreover, thanks to the present invention, an installation has been provided which is constantly on-line without incurring the risk of damage of the electronics caused by the high field proximity.

We claim:

1. In a system for deriving a representation as a function of time of high frequency high voltage transients appearing on a high voltage power line, the combination of:
   voltage divider means coupled to said power line at a point of measurement for deriving at low voltage at a first location a first analog signal representing said transients;
   a first metallic enclosure surrounding said first location and connected to ground potential;
   frequency modulation means disposed at a second location in close proximity to said first location and responsive to said first analog signal for frequency modulating said first analog signal and for converting the resulting frequency-encoded electrical signal into a frequency-encoded optical signal;
   a second metallic enclosure at ground potential surrounding said frequency modulating means;
   fiber optic means for transmitting said frequency-encoded optical signal out of said second enclosure onto a remote location; and
   means at said remote location for converting said frequency-encoded optical signal into a second analog signal representative of said first analog signal.

2. The system of claim 1 with a third enclosure at ground potential surrounding said first and second enclosures for screening the same from electrical noise due to said power line.

3. The system of claim 2, with a fourth metallic enclosure within said third metallic enclosure, with direct current power supply means within said fourth enclosure and responsive to an AC power source for supplying power to said frequency modulation means within said second metallic enclosure.

4. The system of claim 3, with a fifth metallic enclosure within said third metallic enclosure;
   with an isolation transformer within said fifth metallic enclosure responsive to an AC power source out-side said third metallic enclosure for supplying AC power to said direct current power supply means of said fourth metallic enclosure.

5. The system of claim 1 with said frequency modulation means of said second metallic enclosure including first means responsive to said first analog signal for generating a frequency-encoded electrical signal representative of the magnitude of said first analog signal and second means responsive to said frequency-encoded electrical signal for generating said optical signal in frequency-encoded form, said second means being coupled to said fiber optic means.

6. The system of claim 5 with third means at said remot location coupled to said fiber optic means for converting said frequency-encoded optical signal into a second frequency-encoded electrical signal; and with fourth means at said remote location responsive to said second frequency-encoded electrical signal for generating a second analog signal having a magnitude in relation to said first analog signal.

7. The system of claim 6 with first low-pass filter means interposed before said first means and responsive to said first analog signal, with second low-pass filter means interposed at the input of said fourth means and responsive to said second frequency-encoded electrical signal, and third low-pass filter means coupled at the outut of said fourth means and operative on said second analog signal.

8. The system of claim 7, with said first, second and third filter means forming three two-pole stages of a Butterworth filter having as a unit a response equivalent to a six-pole Butterworth filter ranging from DC to 125 KHz.

9. The system of claim 5 with said first means including a first phase-locked-looped device.

10. The system of claim 6 with said fourth means including a second phase-locked-loop device.

11. The system of claim 5 with a series network of Zener diodes being mounted at the input of said first means relative to ground for protection thereof.

* * * * *